United States Patent
Katrak

(10) Patent No.: US 10,796,505 B2
(45) Date of Patent: Oct. 6, 2020

(54) DIAGNOSTIC SYSTEM FOR A VEHICLE ELECTRICAL SYSTEM

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 231 days.

(21) Appl. No.: 16/014,422

(22) Filed: Jun. 21, 2018

(65) Prior Publication Data

US 2019/0035175 A1 Jan. 31, 2019

Related U.S. Application Data

(60) Provisional application No. 62/539,076, filed on Jul. 31, 2017.

(51) Int. Cl.
*G07C 5/08* (2006.01)
*B60R 16/03* (2006.01)
(Continued)

(52) U.S. Cl.
CPC ........ *G07C 5/0808* (2013.01); *B60R 16/0238* (2013.01); *B60R 16/0315* (2013.01);
(Continued)

(58) Field of Classification Search
CPC .................. G07C 5/0808; G07C 5/085; G01R 19/16547; G01R 19/16528; G01R 31/007;
(Continued)

(56) References Cited

U.S. PATENT DOCUMENTS 4,703,756 A * 11/1987 Gough ............... A61B 5/14865
128/903
5,166,887 A * 11/1992 Farrington ............... H02H 3/00
361/94
(Continued)

FOREIGN PATENT DOCUMENTS

WO WO-8909456 A1 * 10/1989 ............... H02H 3/00

OTHER PUBLICATIONS

U.S. Appl. No. 16/038,331, filed Jul. 18, 2018 entitled Diagnostic System for a Vehicle Electrical System Having a Voltage Regulator.
(Continued)

*Primary Examiner* — Behrang Badii
*Assistant Examiner* — Jalal C Coduroglu
(74) *Attorney, Agent, or Firm* — Buckert Patent & Trademark Law Firm, P.C.; John F. Buckert

(57) ABSTRACT

A diagnostic system includes a microcontroller having a first A/D converter, first and second applications, and a first analog multiplexer electrically between a first voltage regulator and the first A/D converter. The first application sets a first overvoltage diagnostic flag to a first fault value if a first voltage of the first voltage regulator that is measured by the first A/D converter is greater than a first voltage, and in response further transitions a contactor to an open operational state. The second application sets a second overvoltage diagnostic flag to a second fault value if a second voltage of the first voltage regulator that is measured by the first A/D converter is greater than a second voltage, and in response further transitions the contactor to the open operational state.

5 Claims, 12 Drawing Sheets

(51) Int. Cl.
*B60R 16/023* (2006.01)
*G01R 19/25* (2006.01)
*G01R 19/165* (2006.01)
*G01R 31/00* (2006.01)

(52) U.S. Cl.
CPC . *G01R 19/16528* (2013.01); *G01R 19/16547* (2013.01); *G01R 19/2513* (2013.01); *G01R 31/007* (2013.01); *G07C 5/085* (2013.01); *B60R 16/0232* (2013.01)

(58) Field of Classification Search
CPC ............ G01R 19/2513; B60R 16/0315; B60R 16/0238; B60R 16/0232
See application file for complete search history.

(56) References Cited

U.S. PATENT DOCUMENTS

| | | | | |
|---|---|---|---|---|
| 5,170,360 A * | 12/1992 | Porter | ...................... | H02H 3/00 700/293 |
| 5,185,705 A * | 2/1993 | Farrington | ............... | H02H 3/00 361/115 |
| 5,973,499 A * | 10/1999 | Schulmann | .......... | G01R 31/007 324/102 |
| 7,103,460 B1 * | 9/2006 | Breed | ................ | B60C 23/0408 701/29.1 |
| 7,421,321 B2 * | 9/2008 | Breed | ..................... | B60C 11/24 340/442 |
| 8,838,328 B2 * | 9/2014 | Hardesty | ................. | F02D 41/22 701/32.8 |
| 9,728,359 B1 * | 8/2017 | Katrak | .................. | H01H 47/002 |
| 9,784,771 B1 * | 10/2017 | Katrak | ............... | G01R 1/07378 |
| 10,261,115 B2 * | 4/2019 | Katrak | ............... | G01R 31/3835 |
| 10,309,993 B2 * | 6/2019 | Katrak | ............... | G01R 19/2503 |
| 10,338,145 B2 * | 7/2019 | Katrak | ............... | G01R 19/2516 |
| 10,481,191 B2 * | 11/2019 | Katrak | ............... | G01R 31/3278 |
| 10,605,846 B2 * | 3/2020 | Katrak | ................. | G01R 31/007 |
| 2005/0273218 A1 * | 12/2005 | Breed | ..................... | B60R 21/20 701/2 |
| 2011/0221604 A1 * | 9/2011 | Johnson | ................. | H02J 7/0068 340/664 |
| 2014/0005881 A1 * | 1/2014 | Hardesty | ................. | F02D 41/22 701/32.8 |
| 2016/0171795 A1 * | 6/2016 | Hardesty | ............ | G01R 31/2829 701/31.4 |
| 2017/0343614 A1 * | 11/2017 | Katrak | ................... | G01R 31/396 |
| 2017/0365996 A1 * | 12/2017 | Katrak | ............. | G01R 19/16576 |
| 2017/0373358 A1 * | 12/2017 | Katrak | .................... | G06F 13/14 |
| 2018/0323025 A1 * | 11/2018 | Katrak | ............... | G01R 31/3278 |
| 2019/0025378 A1 * | 1/2019 | Katrak | ................ | G01R 31/006 |
| 2019/0033359 A1 * | 1/2019 | Katrak | ................ | G01R 31/007 |
| 2019/0036328 A1 * | 1/2019 | Katrak | .................. | H02H 3/207 |

OTHER PUBLICATIONS

U.S. Appl. No. 16/044,671, filed Jul. 25, 2018 entitled Diagnostic System for a Vehicle Electrical System Having First and Second Voltage Regulators.

* cited by examiner

DIAGNOSTIC SYSTEM FOR A VEHICLE ELECTRICAL SYSTEM

CROSS-REFERENCE TO RELATED APPLICATION

This application claims priority to U.S. Provisional Patent Application No. 62/539,076 filed on Jul. 31, 2017, the entire contents of which are hereby incorporated by reference herein.

BACKGROUND

The inventor herein has recognized a need for an improved diagnostic system for a vehicle electrical system that monitors first and second voltage regulators utilizing first and second analog multiplexers, respectively, and first and second analog-to-digital converters, respectively. The diagnostic system further utilizes redundant applications to transition a contactor to an open operational state if the first voltage regulator has either an overvoltage condition or an undervoltage condition. Further, the diagnostic system utilizes redundant applications to transition the contactor to the open operational state if the second voltage regulator has either the overvoltage condition or the undervoltage condition.

SUMMARY

A diagnostic system for a vehicle electrical system in accordance with an exemplary embodiment is provided. The diagnostic system includes a microcontroller having a first A/D converter and first and second applications. The diagnostic system further includes a first analog multiplexer having an input port electrically coupled to a first voltage regulator, and an output port electrically coupled to the first A/D converter. The first application sets a first overvoltage diagnostic flag equal to a first fault value if a first voltage of the first voltage regulator that is measured by the first A/D converter is greater than a first maximum voltage. The first application transitions a contactor to an open operational state if the first overvoltage diagnostic flag is equal to the first fault value. The second application sets a second overvoltage diagnostic flag to a second fault value if a second voltage of the first voltage regulator that is measured by the first A/D converter is greater than a second maximum voltage. The second maximum voltage is greater than the first maximum voltage. The second fault value is different than the first fault value. The second application transitions the contactor to the open operational state if the second overvoltage diagnostic flag is equal to the second fault value.

DETAILED DESCRIPTION

Figure 1:
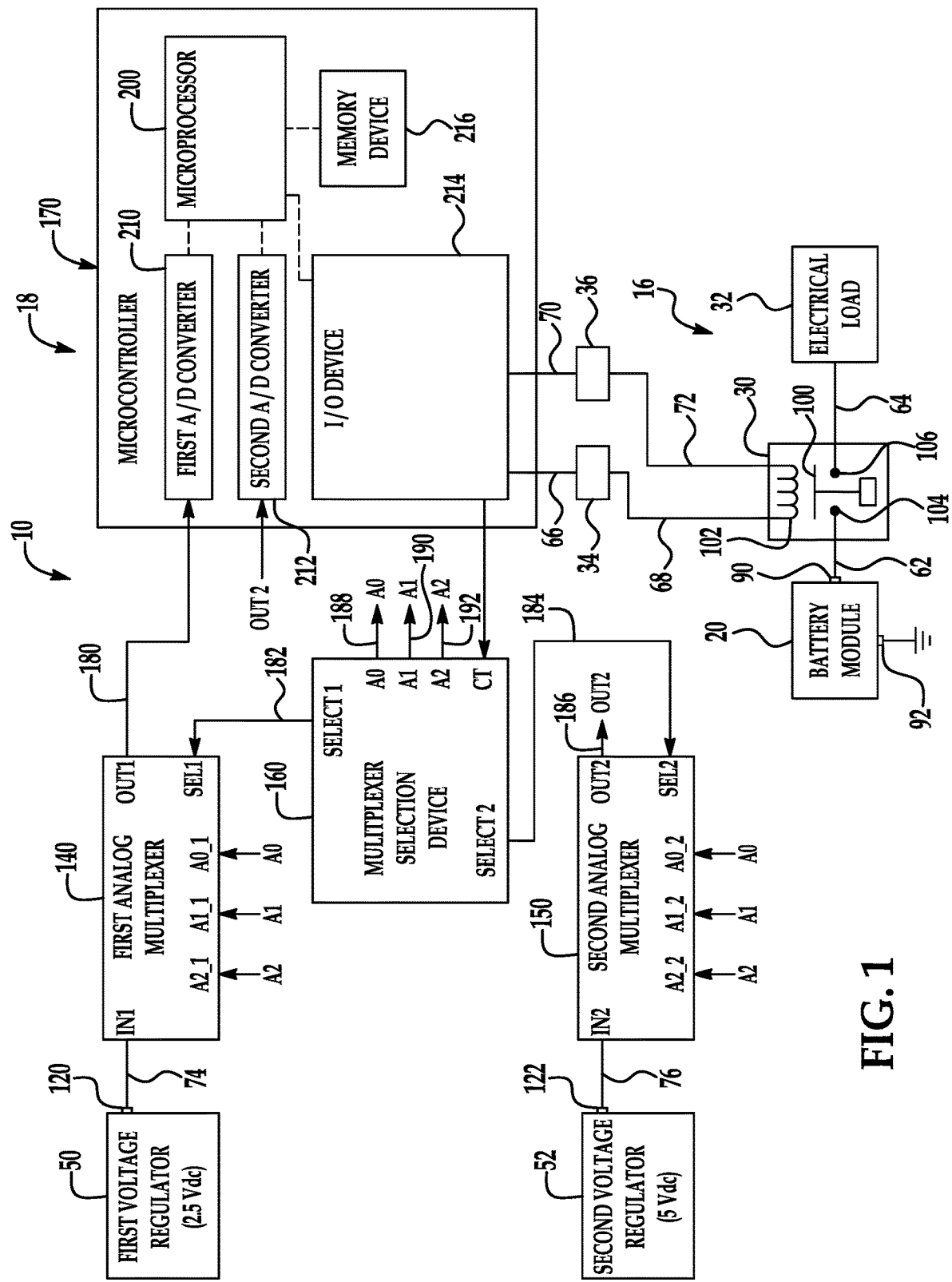
FIG. 1 is a schematic of a vehicle having a vehicle electrical system and a diagnostic system in accordance with an exemplary embodiment.

Referring to FIG. 1 a vehicle 10 is provided. The vehicle 10 includes a vehicle electrical system 16, and a diagnostic system 18 in accordance with an exemplary embodiment.

The vehicle electrical system 16 includes a battery module 20, a contactor 30, a voltage driver 34, a voltage driver 36, electrical lines 62, 64, 66, 68, 70, 72, 74, 76, a first voltage regulator 50, and a second voltage regulator 52.

An advantage of the diagnostic system 18 is that the system 18 utilizes redundant signal paths and redundant applications to transition a contactor 100 to an open operational state if the first voltage regulator has either an overvoltage condition or an undervoltage condition. Further, the diagnostic system utilizes redundant signal paths and redundant applications to transition the contactor to the open operational state if the second voltage regulator has either the overvoltage condition or the undervoltage condition.

For purposes of understanding, a few terms utilized herein will be explained.

The term "node" is a region or a location in an electrical circuit.

The terms "voltage value indicative of a voltage" means the voltage value is proportional to the voltage.

The term "open operational state" means a state in which an electrical current does not flow therethrough.

The term "A/D converter" means an analog-to-digital voltage converter.

The term "application" means a software application.

The term "maximum voltage" means an upper threshold voltage.

The term "minimum voltage" means a lower threshold voltage.

The battery module 20 includes a positive terminal 90 and a negative terminal 92. In an exemplary embodiment, the battery module 20 generates substantially 48 Vdc between the positive terminal 90 and the negative terminal 92. The positive terminal 90 is electrically coupled to a node 104 of the contactor 30. The negative terminal 92 is electrically coupled to electrical ground.

The contactor 30 has a contact 100, a contactor coil 102, a first node 104, and a second node 106. The first node 104 is electrically coupled to the positive terminal 90 of the battery module 20 utilizing the electrical line 62. The second node 106 is electrically coupled to the electrical load 32 utilizing the electrical line 64. When the microcontroller 170 generates first and second control signals that are received by the voltage driver 34 and the voltage driver 36, respectively, the contactor coil 102 is energized which transitions the contact 100 to a closed operational state. Alternately, when the microcontroller 170 generates third and fourth control signals that are received by the voltage driver 34 and the voltage driver 36, respectively, the contactor coil 102 is de-energized which transitions the contact 100 to an open operational state. In an exemplary embodiment, the third and fourth control signals can each be a ground voltage level.

The voltage driver 34 and the voltage driver 36 are provided to energize or de-energize the contactor coil 102. The voltage driver 34 is electrically coupled to the digital input-output device 214 of the microcontroller 170 utilizing the electrical line 66. The voltage driver 34 is further electrically coupled to a first end of the contactor coil 102 utilizing the electrical line 68. The voltage driver 34 energizes the contactor coil 102, when the voltage driver 34 receives a control signal from the microcontroller 170.

The voltage driver 36 is electrically coupled to the microcontroller 170 utilizing the electrical line 70. The voltage driver 36 is further electrically coupled to a second end of the contactor coil 102 utilizing the electrical line 72. The voltage driver 36 is configured to conduct an electrical current therethrough to the electrical ground for energizing the contactor coil 102, when the voltage driver 36 receives a control signal from the microcontroller 170.

The electrical load 32 is electrically coupled to the second node 106 of the contactor 30. When the contactor 30 has a closed operational state, a positive voltage from the battery module 20 is applied to the electrical load 32 for energizing the electrical load 32. When the contactor 30 has an open operational state, the positive voltage from the battery module 20 is removed from the electrical load 32 which de-energizes the electrical load 32.

The first voltage regulator 50 has an output terminal 120 that outputs a first voltage (e.g., substantially 2.5 Vdc) therefrom. The output terminal 120 of the first voltage regulator 50 is electrically coupled to the input port IN1 of the first analog multiplexer 140.

The voltage regulator 52 has an output terminal 122 that outputs a second voltage (e.g., substantially 5.0 Vdc) therefrom. The output terminal 122 of the voltage regulator 52 is electrically coupled to the input port IN2 of the second analog multiplexer 150.

The diagnostic system 18 implements the diagnostic method described herein that is associated with the first and second voltage regulators 50, 52. The diagnostic system 18 includes a first analog multiplexer 140, a second analog multiplexer 150, a multiplexer selection device 160, a microcontroller 170, and electrical lines 180, 182, 184, 186, 188, 190, 192.

The first analog multiplexer 140 is provided to route the voltage at the input port IN1 to the output port OUT1. The first analog multiplexer 140 has the input ports IN1, the output port OUT1, a select port SEL1, and address ports A0_1, A1_1, A2_1. The input port IN1 is electrically coupled to the output terminal 120 of the first voltage regulator 50 utilizing the electrical line 74. The output port OUT1 is electrically coupled to the A/D converter 210 utilizing the electrical line 180. The address ports A0_1, A1_1, A2_1 are electrically coupled to the address ports A0, A1, A2, respectively, of the multiplexer selection device 160 utilizing the electrical lines 188, 190, 192. The select port SEL1 is electrically coupled to the select port SELECT1 of the multiplexer selection device 160 utilizing the electrical line 182.

When the multiplexer selection device 160 outputs a high logic level that is received at the select port SEL1, the first analog multiplexer 140 is selected. Further, the multiplexer selection device 160 outputs the address signals A0, A1, A2 that are received at the address ports A0_1, A1_1, A2_1, respectively, to select the input port IN1 to route the voltage from the first voltage regulator 50 to the output port OUT1. Further, the A/D converter 210 measures the received voltage and generates an associated voltage value that is received by the microprocessor 200.

The second analog multiplexer 150 is provided to route the voltage at the input port IN2 to the output port OUT2. The second analog multiplexer 150 has the input port IN2, the output port OUT2, a select port SEL2, and address ports A0_2, A1_2, A2_2. The output port OUT2 is electrically coupled to the A/D converter 212 utilizing the electrical line 186. The address ports A0_2, A1_2, A2_2 are electrically coupled to the address ports A0, A1, A2, respectively of the multiplexer selection device 160 utilizing the electrical lines 188, 190, 192. The select port SEL2 is electrically coupled to the select port SELECT2 of the multiplexer selection device 160 utilizing the electrical line 184.

When the multiplexer selection device 160 outputs a high logic level that is received at the select port SEL2, the second analog multiplexer 150 is selected. Further, the multiplexer selection device 160 outputs the address signals A0, A1, A2 that are received at the address ports A0_2, A1_2, A2_2, respectively, to select the input port IN2 to route the voltage from the second voltage regulator 52 to the output port OUT2. Further, the A/D converter 210 measures the received voltage and generates an associated voltage value that is received by the microprocessor 200.

The multiplexer selection device 160 is provided to select one of the first and second analog multiplexers 140, 150 at a time for routing the selected signal to one of the A/D converters 210, 212, in response to control signals from the microcontroller 170. The multiplexer selection device 160 includes a control port CT, a select port SELECT1, a select port SELECT2, and address ports A0, A1, A2. The control port CT is electrically coupled to the digital input-output device 214 of the microcontroller 170. The select port SELECT1 is electrically coupled to the select port SEL1 of the first analog multiplexer 140. The select port SELECT2 is electrically coupled to the select port SEL2 of the second analog multiplexer 150. The address ports A0, A1, A2 are electrically coupled to the address ports A0_1, A1_1, A2_1, respectively, of the first analog multiplexer 140 and to address ports A0_2, A1_2, A2_2, respectively, of the second analog multiplexer 150.

When the multiplexer selection device 160 receives a control signal from at the control port CT indicating a specific analog multiplexer to select and a specific port therein, the multiplexer selection device 160 generates a high logic level at one of the select ports SEL1, SEL2, and corresponding signals in the address ports A0, A1, A2.

Figure 2:
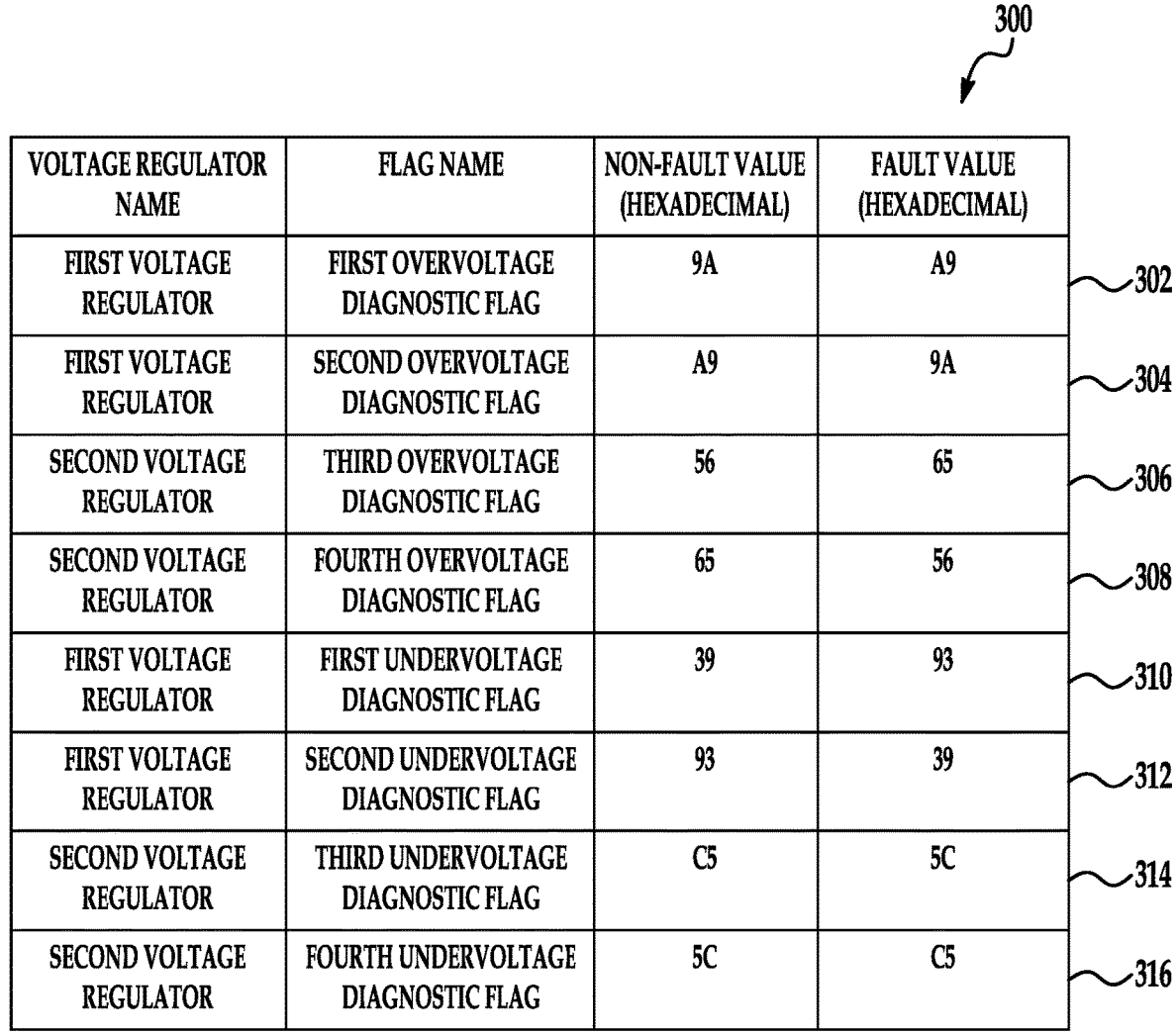
FIG. 2 is a table of diagnostic flag values that are utilized by the diagnostic system of FIG. 1.
Figure 3:
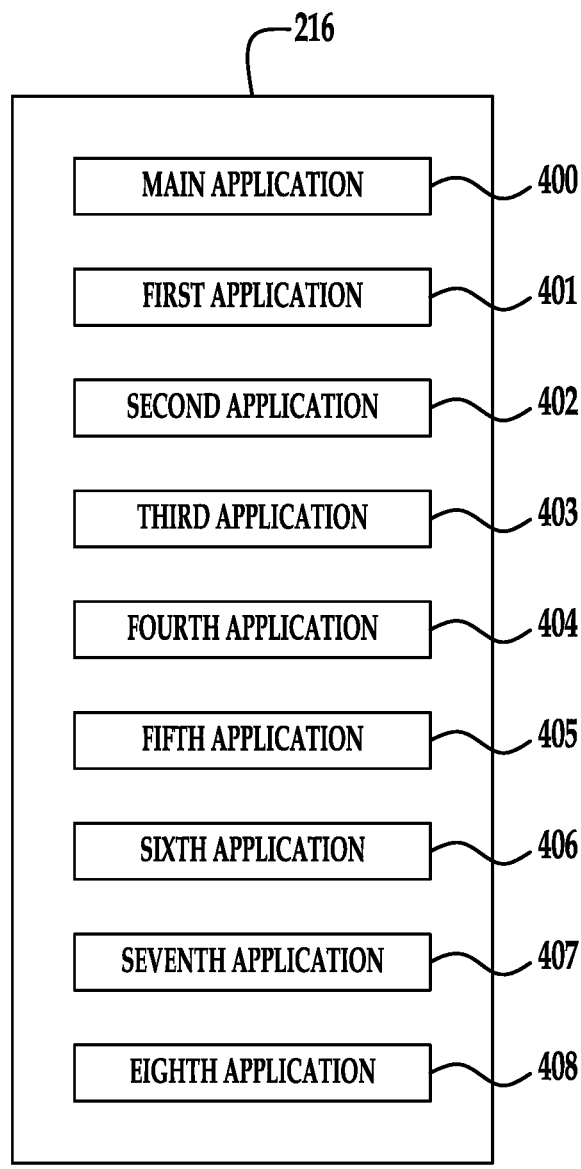
FIG. 3 is a block diagram of a memory device having a main application and first, second, third, fourth, fifth, sixth, seventh, eighth applications stored therein, that are utilized by the diagnostic system of FIG. 1.

Referring to FIGS. 1-3, the microcontroller 170 implements in part the diagnostic method described herein. In particular, the microcontroller 170 has the microprocessor 200 which accesses a table 300 (shown in FIG. 2) in the memory device 216 and executes a main application 400, a first application 401, a second application 402, a third application 403, a fourth application 404, a fifth application 405, a sixth application 406, a seventh application 407, and an eighth application 408 stored in the memory device 216 to implement the diagnostic method. The memory device 216 stores data, tables, and the software applications utilized by the microprocessor 200. The microprocessor 200 is operably coupled to the memory device 216, the A/D converters 210, 212, and the digital input-output device 214.

The digital input-output device 214 is electrically coupled to the multiplexer selection device 160, the voltage drivers 34, 36. The digital input-output device 214 outputs control signals that are received by the voltage drivers 34, 36 for controlling the operation of the contactor 30. Further, the digital input-output device 214 outputs control signals that are received by the multiplexer selection device 160 to select one of the first and second analog multiplexers 140, 150 and an associated input port thereof.

The first A/D converter 210 is electrically coupled to the output terminal OUT1 of the first analog multiplexer 140 utilizing the electrical line 180. The first A/D converter 210 generates a voltage value based on the received voltage from the first analog multiplexer 140 that is received by the microprocessor 200.

The second A/D converter 212 is electrically coupled to the output terminal OUT2 of the second analog multiplexer 150 utilizing the electrical line 186. The second A/D converter 212 generates a voltage value based on the received voltage from the second analog multiplexer 150 that is received by the microprocessor 200.

Referring to FIG. 2, a brief description of the table 300 utilized by the microcontroller 170 will now be explained. The table 300 includes records 302, 304, 306, 308, 310, 312, 314, 316 each having a voltage regulator name, a flag name, a non-fault value (e.g., hexadecimal value) associated with the voltage regulator, and a fault value (e.g., hexadecimal value) associated with the voltage regulator. Each of the fault values have a Hamming distance of at least four from one another. Also, each of the non-fault values have a Hamming distance of at least four from one another. Further, each of the fault values have a Hamming distance of at least four from the non-fault values.

For example, the record 302 includes a voltage regulator name "first voltage regulator", a flag name "first overvoltage diagnostic flag", a non-fault value "9A" hexadecimal, and a fault value "A9" hexadecimal.

Further, the record 304 includes a voltage regulator name "first voltage regulator", a flag name "second overvoltage diagnostic flag", a non-fault value "A9" hexadecimal, and a fault value "9A" hexadecimal.

Also, the record 306 includes a voltage regulator name "second voltage regulator", a flag name "third overvoltage diagnostic flag", a non-fault value "56" hexadecimal, and a fault value "65" hexadecimal.

Further, the record 308 includes a voltage regulator name "second voltage regulator", a flag name "fourth overvoltage diagnostic flag", a non-fault value "65" hexadecimal, and a fault value "56" hexadecimal.

Also, the record 310 includes a voltage regulator name "first voltage regulator", a flag name "first undervoltage diagnostic flag", a non-fault value "39" hexadecimal, and a fault value "93" hexadecimal.

Further, the record 312 includes a voltage regulator name "second voltage regulator", a flag name "second undervoltage diagnostic flag", a non-fault value "93" hexadecimal, and a fault value "39" hexadecimal.

Also, the record 314 includes a voltage regulator name "second voltage regulator", a flag name "third undervoltage diagnostic flag", a non-fault value "C5" hexadecimal, and a fault value "5C" hexadecimal.

Still further, the record 316 includes a voltage regulator name "second voltage regulator", a flag name "fourth undervoltage diagnostic flag", a non-fault value "5C" hexadecimal, and a fault value "C5" hexadecimal.

Referring to FIGS. 1 and 3-12, a flowchart of a diagnostic method for the vehicle electrical system 16 in accordance with another exemplary embodiment will now be explained. The flowchart includes the main application 400, the first application 401, the second application 402, the third application 403, the fourth application 404, the fifth application 405, the sixth application 406, the seventh application 407, and the eighth application 408.

Figure 4:
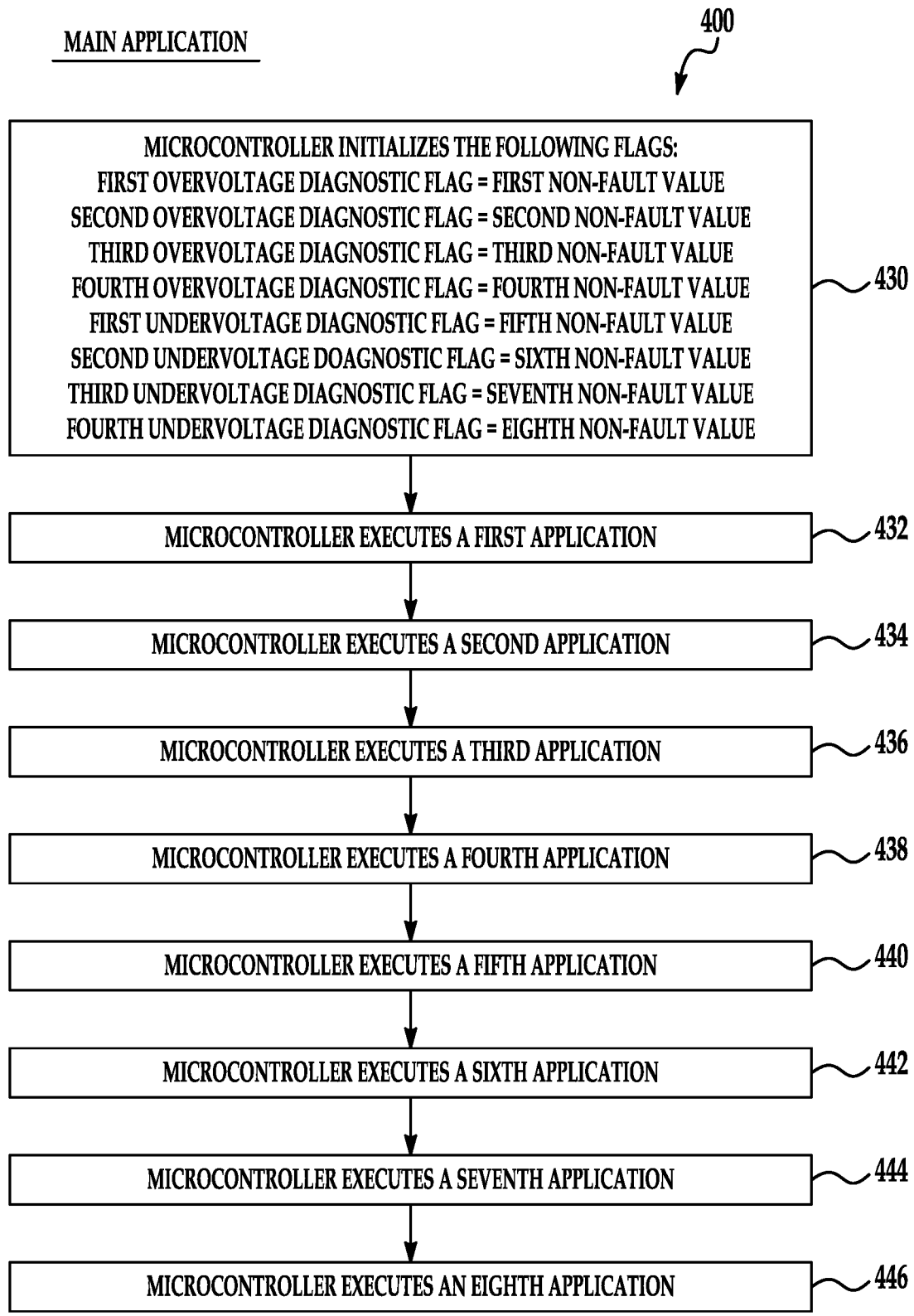
FIGS. 4-12 are flowcharts of a diagnostic method utilized by the diagnostic system of FIG. 1.

Referring to FIGS. 1 and 4, the main application 400 will now be explained.

At step 430, the microcontroller 170 initializes the following flags:
first overvoltage diagnostic flag=first non-fault value (e.g., 9A hexadecimal shown in record 302 in table 300 in FIG. 2);
second overvoltage diagnostic flag=second non-fault value (e.g., A9 hexadecimal shown in record 304 in table 300 in FIG. 2);
third overvoltage diagnostic flag=third non-fault value (e.g., 56 hexadecimal shown in record 306 in table 300 in FIG. 2);
fourth overvoltage diagnostic flag=fourth non-fault value (e.g., 65 hexadecimal shown in record 308 in table 300 in FIG. 2);
first undervoltage diagnostic flag=fifth non-fault value (e.g., 39 hexadecimal shown in record 310 in table 300 in FIG. 2);
second undervoltage diagnostic flag=sixth non-fault value (e.g., 93 hexadecimal shown in record 312 in table 300 in FIG. 2);
third undervoltage diagnostic flag=seventh non-fault value (e.g., C5 hexadecimal shown in record 314 in table 300 in FIG. 2);
fourth undervoltage diagnostic flag=eighth non-fault value (e.g., 5C hexadecimal shown in record 316 in table 300 in FIG. 2).

After step 430, the method advances to step 432.

At step 432, the microcontroller 170 executes the first application 401. After step 432, the method advances to step 434.

At step 434, the microcontroller 170 executes the second application 402. After step 434, the method advances to step 436.

At step 436, the microcontroller 170 executes the third application 403. After step 436, the method advances to step 438.

At step 438, the microcontroller 170 executes the fourth application 404. After step 438, the method advances to step 440.

At step 440, the microcontroller 170 executes the fifth application 405. After step 440, the method advances to step 442.

At step 442, the microcontroller 170 executes the sixth application 406. After step 442, the method advances to step 444.

At step 444, the microcontroller 170 executes the seventh application 407. After step 444, the method advances to step 446.

At step 446, the microcontroller 170 executes the eighth application 408. After step 446, the method is exited.

Figure 5:
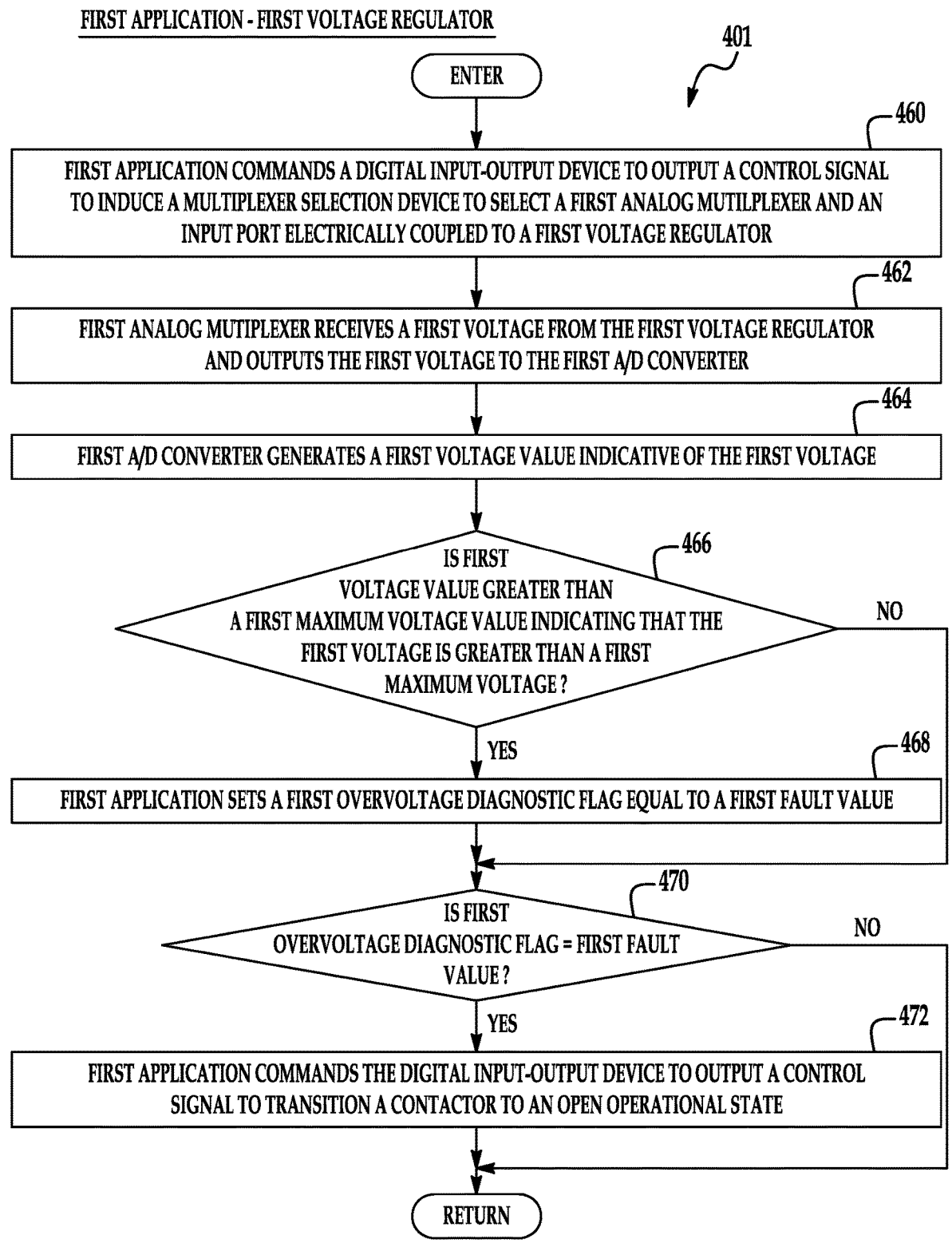

Referring to FIGS. 1 and 5, the first application 401 will now be explained.

At step 460, the first application 401 commands a digital input-output device 214 to output a control signal to induce a multiplexer selection device 160 to select a first analog multiplexer 140 and an input port IN1 electrically coupled to a first voltage regulator 50. After step 460, the method advances to step 462.

At step 462, the first analog multiplexer 140 receives a first voltage from the first voltage regulator 50 and outputs the first voltage to the first A/D converter 210. After step 462, the method advances to step 464.

At step 464, the first A/D converter 210 generates a first voltage value indicative of the first voltage. After step 464, the method advances to step 466.

At step 466, the first application 401 makes a determination as to whether the first voltage value is greater than a first maximum voltage value indicating that the first voltage is greater than a first maximum voltage. If the value of step 466 equals "yes", the method advances to step 468. Otherwise, the method advances to step 470.

At step 468, the first application 401 sets a first overvoltage diagnostic flag equal to a first fault value (e.g., A9 hexadecimal shown in record 302 in table 300 in FIG. 2). After step 468, the method advances to step 470.

At step 470, the first application 401 makes a determination as to whether the first overvoltage diagnostic flag is equal to the first fault value. If the value of step 470 equals "yes", the method advances to step 472. Otherwise, the method returns to the main application 400.

At step 472, the first application 401 commands the digital input-output device 214 to output a control signal to transition a contactor 30 to an open operational state. After step 472, the method returns to the main application 400.

Figure 6:
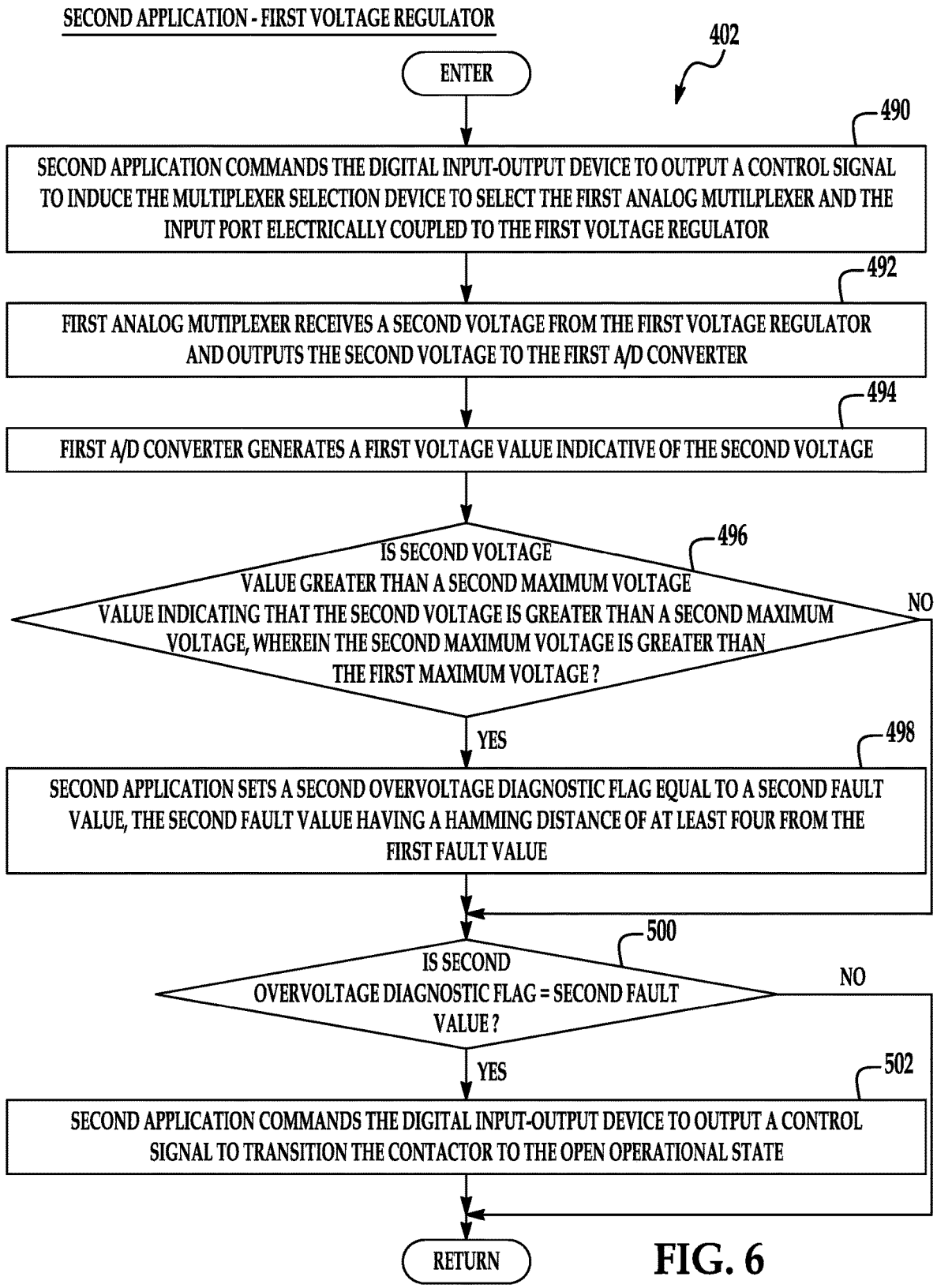

Referring to FIGS. 1 and 6, the second application 402 will now be explained.

At step 490, the second application 402 commands the digital input-output device 214 to output a control signal to induce a multiplexer selection device 160 to select the first analog multiplexer 140 and the input port IN1 electrically coupled to the first voltage regulator 50. After step 490, the method advances to step 492.

At step 492, the first analog multiplexer 140 receives a second voltage from the first voltage regulator 50 and outputs the second voltage to the first A/D converter 210. After step 492, the method advances to step 494.

At step 494, the first A/D converter 210 generates a second voltage value indicative of the second voltage. After step 494, the method advances to step 496.

At step 496, the second application 402 makes a determination as to whether the second voltage value is greater than a second maximum voltage value indicating that the second voltage is greater than a second maximum voltage, wherein the second maximum voltage is greater than the first maximum voltage. If the value of step 496 equals "yes", the method advances to step 498. Otherwise, the method advances to step 500.

At step 498, the second application 402 sets a second overvoltage diagnostic flag equal to a second fault value (e.g., 9A hexadecimal shown in record 304 in table 300 in FIG. 2). The second fault value has a Hamming distance of at least four from the first fault value. After step 498, the method advances to step 500.

At step 500, the second application 402 makes a determination as to whether the second overvoltage diagnostic flag is equal to the second fault value. If the value of step 500 equals "yes", the method advances to step 502. Otherwise, the method returns to the main application 400.

At step 502, the second application 402 commands the digital input-output device 214 to output a control signal to transition the contactor 30 to the open operational state. After step 502, the method returns to the main application 400.

Figure 7:
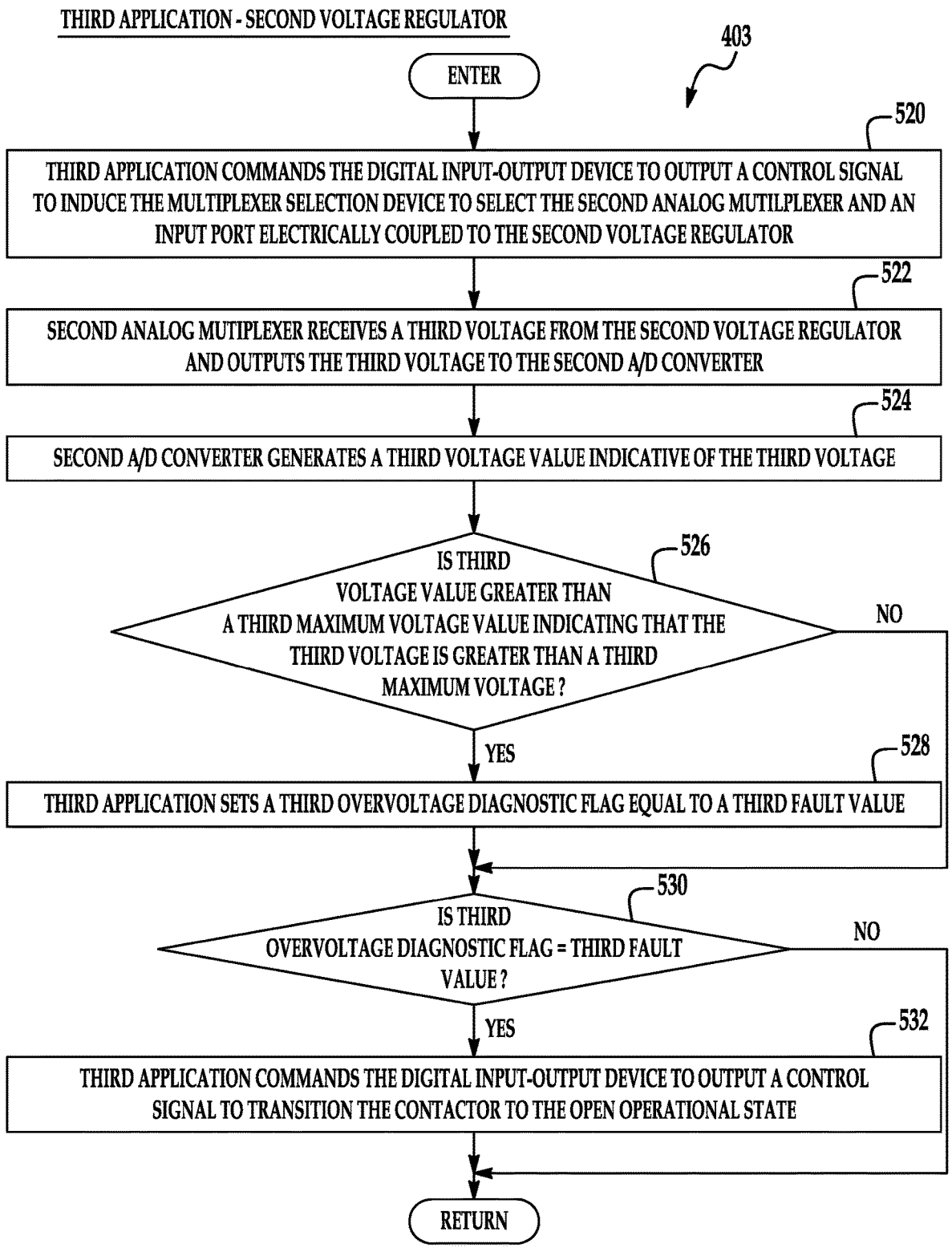

Referring to FIGS. 1 and 7, the third application 403 will now be explained.

At step 520, the third application 403 commands the digital input-output device 214 to output a control signal to induce a multiplexer selection device 160 to select the second analog multiplexer 150 and an input port IN2 electrically coupled to the second voltage regulator 52. After step 520, the method advances to step 522.

At step 522, the second analog multiplexer 150 receives a third voltage from the second voltage regulator 52 and outputs the third voltage to the second A/D converter 212. After step 522, the method advances to step 524.

At step 524, the second A/D converter 212 generates a third voltage value indicative of the third voltage. After step 524, the method advances to step 526.

At step 526, the third application 403 makes a determination as to whether the third voltage value is greater than a third maximum voltage value indicating that the third voltage is greater than a third maximum voltage. If the value of step 526 equals "yes", the method advances to step 528. Otherwise, the method advances to step 530.

At step 528, the third application 403 sets a third overvoltage diagnostic flag equal to a third fault value (e.g., 65 hexadecimal shown in record 306 in table 300 in FIG. 2). After step 528, the method advances to step 530.

At step 530, the third application 403 makes a determination as to whether the third overvoltage diagnostic flag is equal to the third fault value. If the value of step 530 equals "yes", the method advances to step 532. Otherwise, the method returns to the main application 400.

At step 532, the third application 403 commands the digital input-output device 214 to output a control signal to transition the contactor 30 to the open operational state. After step 532, the method returns to the main application 400.

Figure 8:
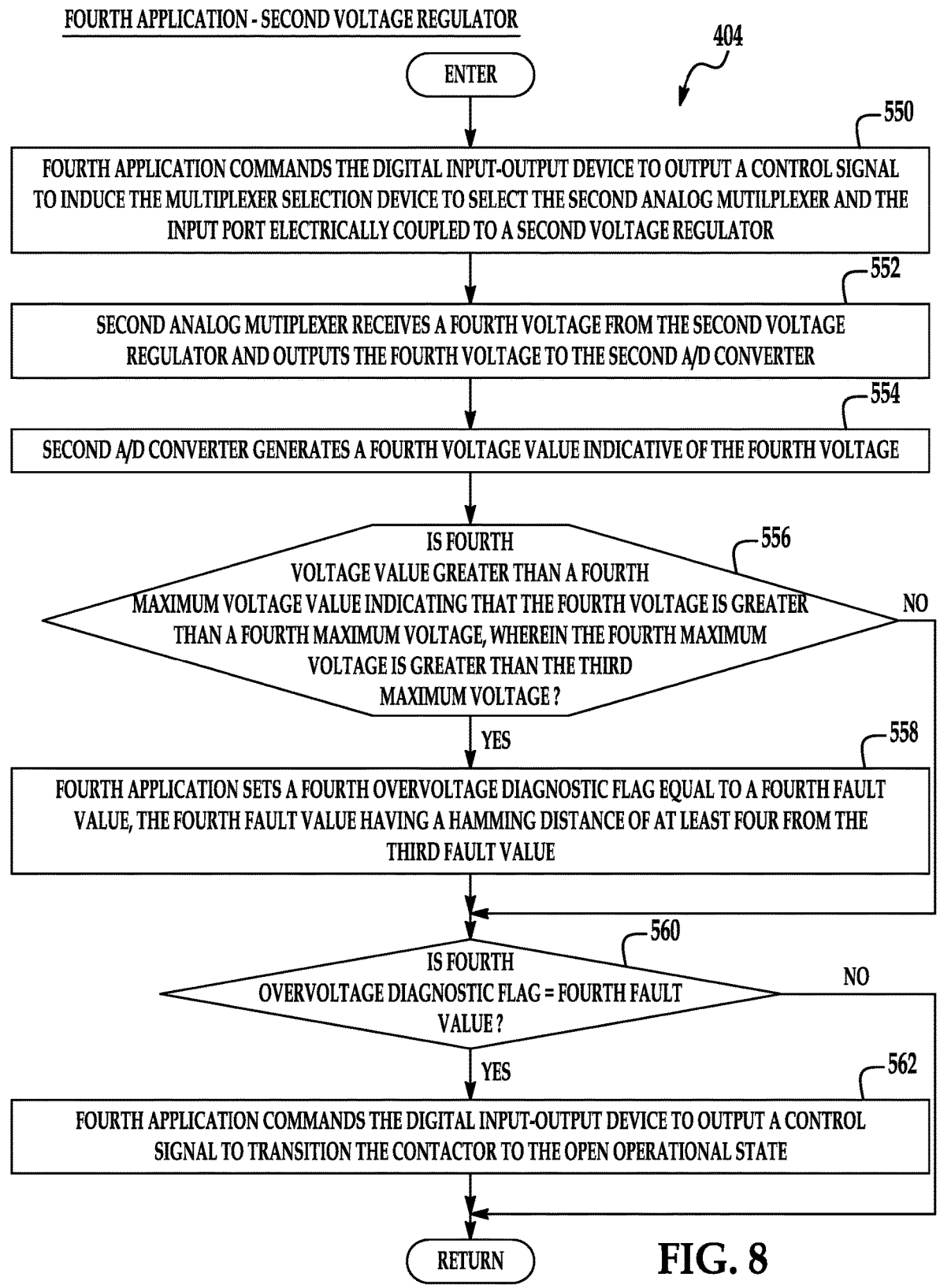

Referring to FIGS. 1 and 8, the fourth application 404 will now be explained.

At step 550, the fourth application 404 commands the digital input-output device 214 to output a control signal to induce a multiplexer selection device 160 to select the second analog multiplexer 150 and the input port IN2 electrically coupled to the second voltage regulator 52. After step 550, the method advances to step 552.

At step 552, the second analog multiplexer 150 receives a fourth voltage from the second voltage regulator 52 and outputs the fourth voltage to the second A/D converter 212. After step 552, the method advances to step 554.

At step 554, the second A/D converter 212 generates a fourth voltage value indicative of the fourth voltage. After step 554, the method advances to step 556.

At step 556, the fourth application 404 makes a determination as to whether the fourth voltage value is greater than a fourth maximum voltage value indicating that the fourth voltage is greater than a fourth maximum voltage, wherein the fourth maximum voltage is greater than the third maximum voltage. If the value of step 556 equals "yes", the method advances to step 558. Otherwise, the method advances to step 560.

At step 558, the fourth application 404 sets a fourth overvoltage diagnostic flag equal to a fourth fault value (e.g., 56 hexadecimal shown in record 308 in table 300 in FIG. 2). The fourth fault value has a Hamming distance of at least four from the third fault value.

At step 560, the fourth application 404 makes a determination as to whether the fourth overvoltage diagnostic flag is equal to the fourth fault value. If the value of step 560 equals "yes", the method advances to step 562. Otherwise, the method returns to the main application 400.

At step 562, the fourth application 404 commands the digital input-output device 214 to output a control signal to transition the contactor 30 to the open operational state. After step 562, the method returns to the main application 400.

Figure 9:
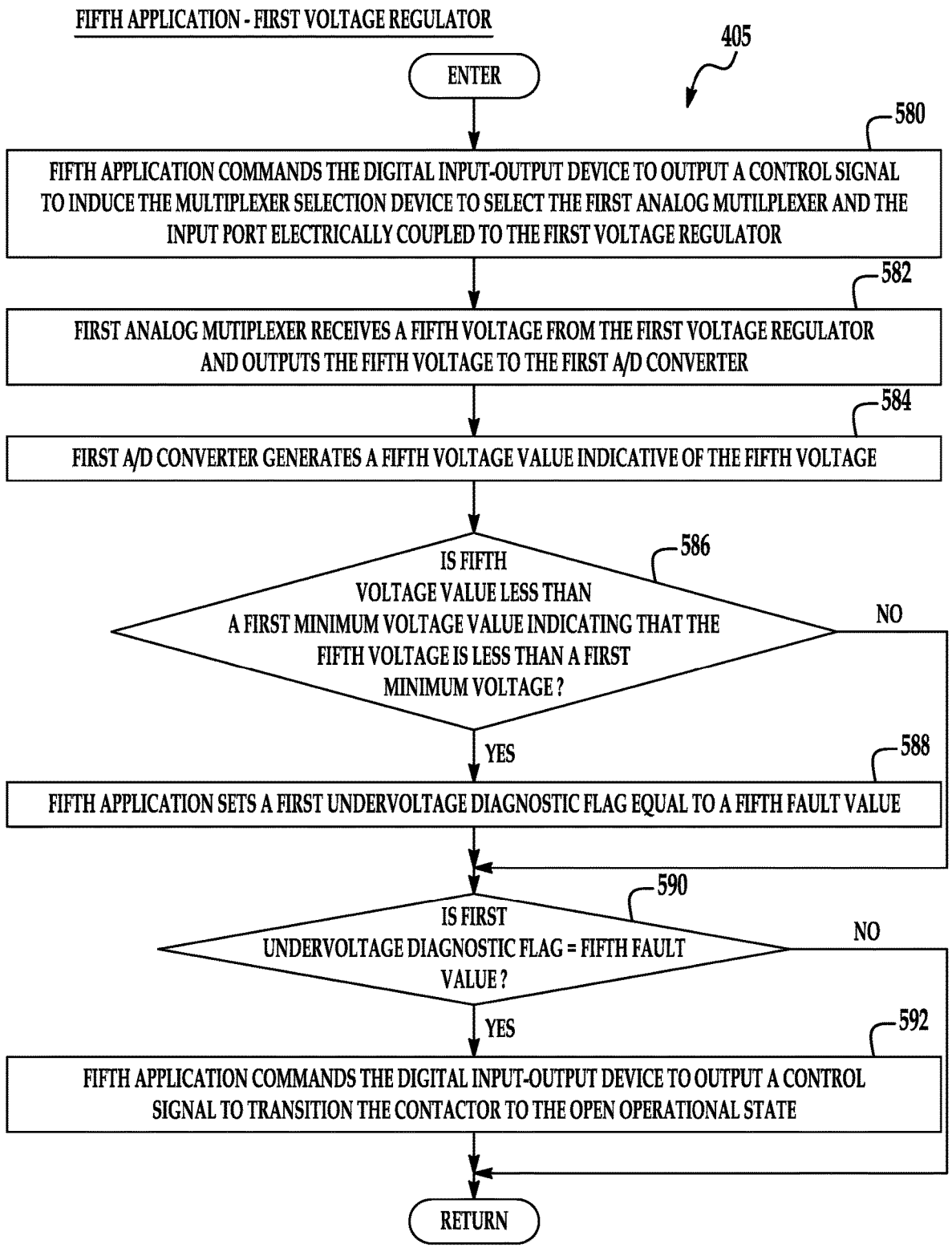

Referring to FIGS. 1 and 9, the fifth application 405 will now be explained.

At step 580, the fifth application 405 commands the digital input-output device 214 to output a control signal to induce a multiplexer selection device 160 to select the first analog multiplexer 140 and the input port IN1 electrically coupled to the first voltage regulator 50. After step 580, the method advances to step 582.

At step 582, the first analog multiplexer 140 receives a fifth voltage from the first voltage regulator 50 and outputs the fifth voltage to the first A/D converter 210. After step 582, the method advances to step 584.

At step 584, the first A/D converter 210 generates a fifth voltage value indicative of the fifth voltage. After step 584, the method advances to step 586.

At step 586, the fifth application 405 makes a determination as to whether the fifth voltage value less than a first minimum voltage value indicating that the fifth voltage is less than a first minimum voltage. If the value of step 586 equals "yes", the method advances to step 588. Otherwise, the method advances to step 590.

At step 588, the fifth application 405 sets a first undervoltage diagnostic flag equal to a fifth fault value (e.g., 93 hexadecimal shown in record 310 in table 300 in FIG. 2). After step 588, the method advances to step 590.

At step 590, the fifth application 405 makes a determination as to whether the first undervoltage diagnostic flag is equal to the fifth fault value. If the value of step 590 equals "yes", the method advances to step 592. Otherwise, the method returns to the main application 400.

At step 592, the fifth application 405 commands the digital input-output device 214 to output a control signal to transition the contactor 30 to the open operational state. After step 592, the method returns to the main application 400.

Figure 10:
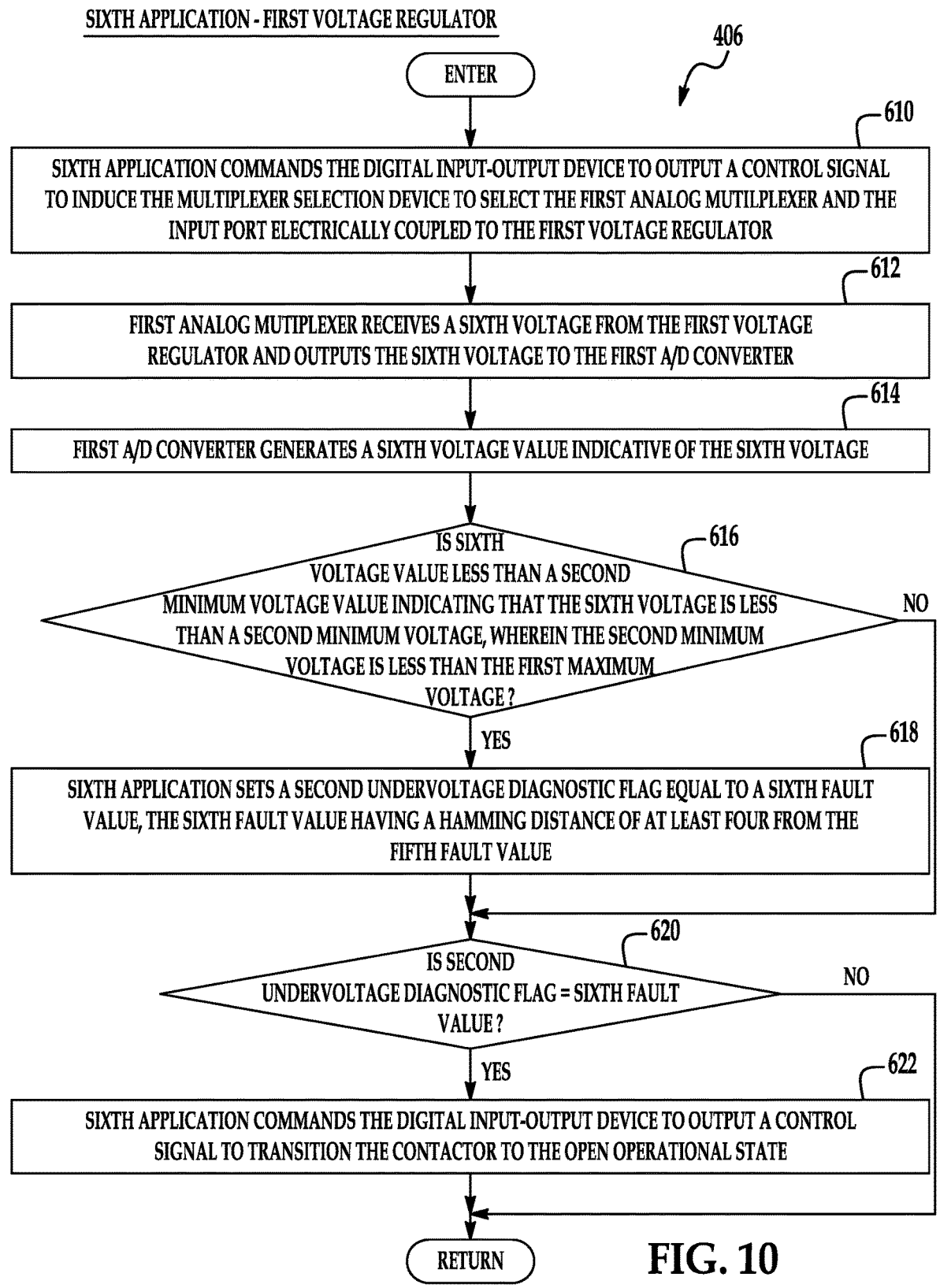

Referring to FIGS. 1 and 10, the sixth application 406 will now be explained.

At step 610, the sixth application 406 commands the digital input-output device 214 to output a control signal to induce a multiplexer selection device 160 to select the first analog multiplexer 140 and the input port IN1 electrically coupled to the first voltage regulator 50. After step 610, the method advances to step 612.

At step 612, the first analog multiplexer 140 receives a sixth voltage from the first voltage regulator 50 and outputs the sixth voltage to the first A/D converter 210. After step 612, the method advances to step 614.

At step 614, the first A/D converter 210 generates a sixth voltage value indicative of the sixth voltage. After step 614, the method advances to step 616.

At step 616, the sixth application 406 makes a determination as to whether the sixth voltage value is less than a second minimum voltage value indicating that the sixth voltage is less than a second minimum voltage, wherein the second minimum voltage is less than the first minimum voltage. If the value of step 616 equals "yes", the method advances to step 618. Otherwise, the method advances to step 620.

At step 618, the sixth application 406 sets a second undervoltage diagnostic flag equal to a sixth fault value (e.g., 39 hexadecimal shown in record 312 in table 300 in FIG. 2). The sixth fault value has a Hamming distance of at least four from the fifth fault value. After step 618, the method advances to step 620.

At step 620, the sixth application 406 makes a determination as to whether the second undervoltage diagnostic flag is equal to the sixth fault value. If the value of step 620 equals "yes", the method advances to step 622. Otherwise, the method returns to the main application 400.

At step 622, the sixth application 406 commands the digital input-output device 214 to output a control signal to transition the contactor 30 to the open operational state. After step 622, the method returns to the main application 400.

Figure 11:
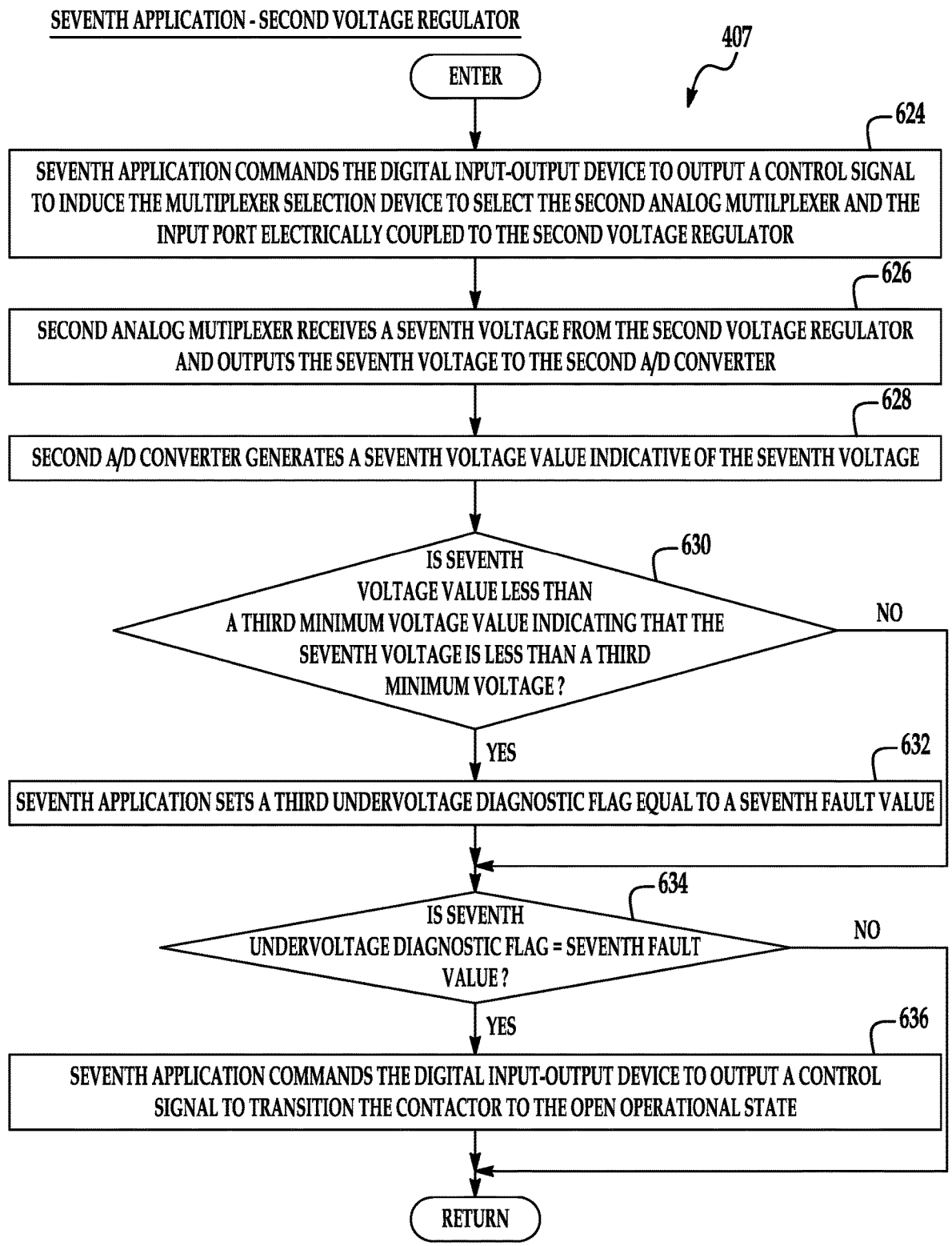

Referring to FIGS. 1 and 11, the seventh application 407 will now be explained.

At step 624, the seventh application 407 commands the digital input-output device 214 to output a control signal to induce a multiplexer selection device 160 to select the second analog multiplexer 150 and the input port IN2 electrically coupled to the second voltage regulator 52. After step 624, the method advances to step 626.

At step 626, the second analog multiplexer 150 receives a seventh voltage from the second voltage regulator 52 and outputs the seventh voltage to the second A/D converter 212. After step 626, the method advances to step 628.

At step 628, the second A/D converter 212 generates a seventh voltage value indicative of the seventh voltage. After step 628, the method advances to step 630.

At step 630, the seventh application 407 makes a determination as to whether the seventh voltage value is less than a third minimum voltage value indicating that the seventh voltage is less than a third minimum voltage. If the value of step 630 equals "yes", the method advances to step 632. Otherwise, the method advances to step 634.

At step 632, the seventh application 407 sets a third undervoltage diagnostic flag equal to a seventh fault value (e.g., 5C hexadecimal shown in record 314 in table 300 in FIG. 2). After step 632, the method advances to step 634.

At step 634, the seventh application 407 makes a determination as to whether the seventh undervoltage diagnostic flag is equal to the seventh fault value. If the value of step 634 equals "yes", the method advances to step 636. Otherwise, the method returns to the main application 400.

At step 636, the seventh application 407 commands the digital input-output device 214 to output a control signal to transition the contactor 30 to the open operational state. After step 636, the method returns to the main application 400.

Figure 12:
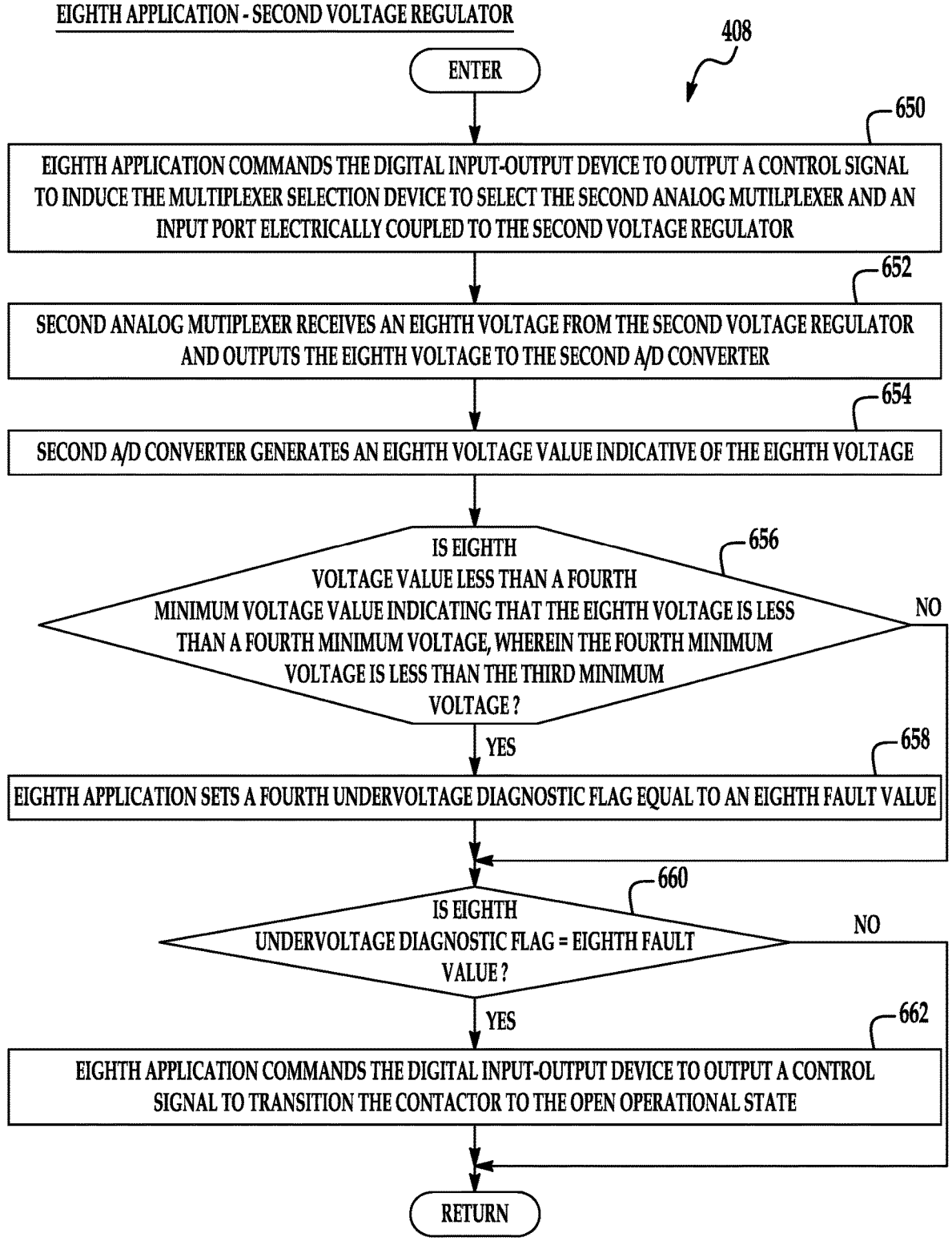

Referring to FIGS. 1 and 12, the eighth application 408 will now be explained.

At step 650, the eighth application 408 commands the digital input-output device 214 to output a control signal to induce a multiplexer selection device 160 to select the second analog multiplexer 150 and an input port IN2 electrically coupled to the second voltage regulator 52. After step 650, the method advances to step 652.

At step 652, the second analog multiplexer 150 receives an eighth voltage from the second voltage regulator 52 and outputs the eighth voltage to the second A/D converter 212. After step 652, the method advances to step 654.

At step 654, the second A/D converter 212 generates an eighth voltage value indicative of the eighth voltage. After step 654, the method advances to step 656.

At step 656, the eighth application 408 makes a determination as to whether the eighth voltage value is less than a fourth minimum voltage value indicating that the eighth voltage is less than a fourth minimum voltage, wherein the fourth minimum voltage is less than the third minimum voltage. If the value of step 656 equals "yes", the method advances to step 658. Otherwise, the method advances to step 660.

At step 658, the eighth application 408 sets a fourth undervoltage diagnostic flag equal to an eighth fault value (e.g., C5 hexadecimal shown in record 316 in table 300 in FIG. 2). After step 658, the method advances to step 660.

At step 660, the eighth application 408 makes a determination as to whether the eighth undervoltage diagnostic flag is equal to the eighth fault value. If the value of step 660 equals "yes", the method advances to step 662. Otherwise, the method returns to the main application 400.

At step 662, the eighth application 408 commands the digital input-output device 214 to output a control signal to transition the contactor 30 to the open operational state. After step 662, the method returns to the main application 400.

The diagnostic system described herein for a vehicle electrical system provides a substantial advantage over other systems. In particular, the diagnostic system described utilizes redundant signal paths and redundant applications to transition a contactor to an open operational state if the first voltage regulator has either an overvoltage condition or an undervoltage condition. Further, the diagnostic system utilizes redundant signal paths and redundant applications to transition the contactor to the open operational state if the second voltage regulator has either the overvoltage condition or the undervoltage condition.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a vehicle electrical system, comprising:
    a microcontroller having a first A/D converter and first and second applications;
    a first analog multiplexer having an input port electrically coupled to a first voltage regulator, and an output port electrically coupled to the first A/D converter;
    wherein the first application is configured to set a first overvoltage diagnostic flag equal to a first fault value if a first voltage of the first voltage regulator that is measured by the first A/D converter is greater than a first maximum voltage;
    the first application is configured to transition a contactor to an open operational state if the first overvoltage diagnostic flag is equal to the first fault value;
    the second application is configured to set a second overvoltage diagnostic flag to a second fault value if a second voltage of the first voltage regulator that is measured by the first A/D converter is greater than a second maximum voltage; the second maximum voltage being greater than the first maximum voltage, the second fault value being different than the first fault value;
    the second application is configured to transition the contactor to the open operational state if the second overvoltage diagnostic flag is equal to the second fault value;
    the microcontroller further includes a second A/D converter and third and fourth applications;
    a second analog multiplexer having an input port electrically coupled to a second voltage regulator, and an output port electrically coupled the second A/D converter;
    the third application is configured to set a third overvoltage diagnostic flag to a third fault value if a third voltage of the second voltage regulator that is measured by the second A/D converter is greater than a third maximum voltage;
    the third application is configured to transition the contactor to the open operational state if the third overvoltage diagnostic flag is equal to the third fault value;
    the fourth application is configured to set a fourth overvoltage diagnostic flag to a fourth fault value if a fourth voltage of the second voltage regulator that is measured by the second A/D converter is greater than a fourth maximum voltage; the fourth maximum voltage being greater than the third maximum voltage, the fourth fault value being different than the third fault value;
    the fourth application is configured to transition the contactor to the open operational state if the fourth overvoltage diagnostic flag is equal to the fourth fault value;
    the third and fourth fault values have a Hamming distance of at least four from one another;
    the microcontroller further includes fifth and sixth applications;
    the fifth application is configured to set a first undervoltage diagnostic flag equal to a fifth fault value if a fifth voltage of the first voltage regulator that is measured by the first A/D converter is less than a first minimum voltage;
    the fifth application is configured to transition the contactor to the open operational state if the first undervoltage diagnostic flag is equal to the fifth fault value;
    the sixth application is configured to set a second undervoltage diagnostic flag to a sixth fault value if a sixth voltage of the first voltage regulator that is measured by the first A/D converter is less than a second minimum voltage; the second minimum voltage being less than the first minimum voltage, the sixth fault value being different than the fifth fault value; and
    the sixth application is configured to transition the contactor to the open operational state if the second undervoltage diagnostic flag is equal to the sixth fault value.

2. The diagnostic system of claim 1, wherein the first and second fault values have a Hamming distance of at least four from one another.

3. The diagnostic system of claim 1, wherein the fifth and sixth fault values have a Hamming distance of at least four from one another.

4. The diagnostic system of claim 1, wherein the microcontroller further includes seventh and eighth applications;
    wherein the seventh application is configured to set a third undervoltage diagnostic flag equal to a seventh fault value if a seventh voltage of the second voltage regulator that is measured by the second A/D converter is less than a third minimum voltage;
    the seventh application is configured to transition the contactor to the open operational state if the third undervoltage diagnostic flag is equal to the seventh fault value;
    the eighth application is configured to set a fourth undervoltage diagnostic flag to an eighth fault value if an eighth voltage of the second voltage regulator that is measured by the second A/D converter is less than a fourth minimum voltage; the fourth minimum voltage being less than the third minimum voltage, the eighth fault value being different than the seventh fault value; and
    the eighth application is configured to transition the contactor to the open operational state if the fourth undervoltage diagnostic flag is equal to the eighth fault value.

5. The diagnostic system of claim 4, wherein the first, second, third, fourth, fifth, sixth, seventh, and eighth fault values have a Hamming distance of at least four from one another.

* * * * *